(12) United States Patent
Wu et al.

(10) Patent No.: US 10,978,332 B2
(45) Date of Patent: Apr. 13, 2021

(54) VACUUM SUCTION APPARATUS

(71) Applicants: Prilit Optronics, Inc., Tainan (TW); Himax Technologies Limited, Tainan (TW)

(72) Inventors: Biing-Seng Wu, Tainan (TW); Chao-Wen Wu, Tainan (TW); Tzung-Ren Wang, Tainan (TW)

(73) Assignee: Prilit Optronics, Inc., Tainan (TW)

( * ) Notice: Subject to any disclaimer, the term of this patent is extended or adjusted under 35 U.S.C. 154(b) by 294 days.

(21) Appl. No.: 15/716,366

(22) Filed: Sep. 26, 2017

(65) Prior Publication Data
US 2018/0096878 A1    Apr. 5, 2018

(30) Foreign Application Priority Data

Oct. 5, 2016 (TW) .................................. 105132128
Mar. 15, 2017 (TW) .................................. 106108614

(51) Int. Cl.
| | |
|---|---|
| H01L 21/683 | (2006.01) |
| H01L 21/67 | (2006.01) |
| H01L 33/00 | (2010.01) |
| H01L 25/075 | (2006.01) |
| H01L 21/687 | (2006.01) |

(52) U.S. Cl.
CPC .... *H01L 21/6838* (2013.01); *H01L 21/67144* (2013.01); *H01L 33/0095* (2013.01); *H01L 21/6875* (2013.01); *H01L 25/0753* (2013.01)

(58) Field of Classification Search
CPC ........... H01L 21/6838; H01L 21/67144; H01L 33/0095; H01L 21/6875; B25B 11/00; B25B 11/02; B25B 11/005; B23Q 3/088; G03F 7/707

USPC ...................................................... 269/20, 21
See application file for complete search history.

(56) References Cited

U.S. PATENT DOCUMENTS

| | | | | |
|---|---|---|---|---|
| 5,443,012 A | * | 8/1995 | Underbrink | A63G 21/20 104/118 |
| 5,803,797 A | * | 9/1998 | Piper | B24B 37/30 125/12 |

(Continued)

FOREIGN PATENT DOCUMENTS

JP    2017022269    *    7/2015

OTHER PUBLICATIONS

Office Action dated Aug. 26, 2020 in corresponding Indian Patent Application No. 201714034565.

*Primary Examiner* — Tyrone V Hall, Jr.
*Assistant Examiner* — Mahdi H Nejad
(74) *Attorney, Agent, or Firm* — Donald E. Stout; Stout, Uxa & Buyan, LLP

(57) ABSTRACT

A vacuum suction apparatus includes a semiconductor substrate with a top portion having grooves and a bottom portion having through holes, wherein each said groove correspondingly connects with at least one said through hole, and the groove has a width greater than a width of the through hole; and a cover plate disposed on a top surface of the semiconductor substrate. At least one edge of the vacuum suction apparatus has a vacuum chamber, which connects with the grooves. In another embodiment, the cover plate is replaced with a vacuum cover disposed above the semiconductor substrate, wherein the vacuum cover and the semiconductor substrate construct a vacuum chamber.

18 Claims, 11 Drawing Sheets

(56) References Cited

U.S. PATENT DOCUMENTS

| | | | | |
|---|---|---|---|---|
| 5,857,667 A * | 1/1999 | Lee | ................ | B25B 11/005 269/21 |
| 6,586,886 B1 * | 7/2003 | Katz | ................ | H01J 37/3244 118/723 E |
| 8,070,199 B2 * | 12/2011 | Na | ................ | H01L 21/6838 294/188 |
| 2003/0047289 A1 * | 3/2003 | Jaussaud | ................ | H01L 21/6838 156/758 |
| 2005/0014390 A1 * | 1/2005 | Li | ................ | H01L 21/6838 438/782 |
| 2007/0158031 A1 * | 7/2007 | Miyake | ................ | H01L 21/67288 156/581 |
| 2007/0252970 A1 * | 11/2007 | Shibazaki | ................ | G03F 7/707 355/72 |
| 2008/0276864 A1 * | 11/2008 | Koelmel | ................ | H01L 21/67115 118/500 |
| 2011/0183108 A1 * | 7/2011 | Tachibana | ................ | B25B 11/005 428/131 |
| 2012/0009660 A1 * | 1/2012 | Pottathil | ................ | C10L 9/00 435/272 |
| 2012/0171815 A1 * | 7/2012 | Maeng | ................ | C23C 16/45578 438/107 |
| 2013/0075982 A1 | 3/2013 | Simmons et al. | | |
| 2013/0095613 A1 * | 4/2013 | Tanaka | ................ | H01L 21/67132 438/113 |
| 2013/0168910 A1 * | 7/2013 | Sun | ................ | B23Q 3/088 269/21 |
| 2015/0151411 A1 * | 6/2015 | Veis | ................ | B41J 11/0085 347/104 |
| 2015/0261102 A1 * | 9/2015 | Lof | ................ | G03F 7/70341 355/30 |
| 2016/0020132 A1 * | 1/2016 | Yudovsky | ................ | C23C 16/458 438/800 |
| 2016/0195579 A1 * | 7/2016 | Simmons | ................ | H01L 21/6838 269/21 |
| 2017/0080548 A1 * | 3/2017 | Xu | ................ | B23K 26/083 |
| 2017/0084477 A1 * | 3/2017 | Kang | ................ | H01L 21/6838 |
| 2017/0266943 A1 * | 9/2017 | Utsugi | ................ | B32B 27/32 |
| 2017/0297920 A1 * | 10/2017 | Richardson | ................ | B01J 19/00 |
| 2017/0345702 A1 * | 11/2017 | Iwabuchi | ................ | B25J 15/0616 |
| 2019/0019718 A1 * | 1/2019 | Wu | ................ | H01L 21/6838 |
| 2019/0221467 A1 * | 7/2019 | Scholz-Goerlach | ................ | B25B 11/005 |

* cited by examiner

VACUUM SUCTION APPARATUS

CROSS-REFERENCE TO RELATED APPLICATIONS

This application claims priority of Taiwan Application No. 105132128, filed on Oct. 5, 2016, and Taiwan Application No. 106108614, filed on Mar. 15, 2017, the entire contents of which are hereby incorporated by reference.

BACKGROUND OF THE INVENTION

1. Field of the Invention

The present invention generally relates to vacuum suction apparatus, and more particularly to vacuum suction apparatus adaptable to transferring micro light-emitting diodes (microLEDs).

2. Description of Related Art

A micro light-emitting diode (microLED, mLED or μLED) display panel is one of flat display panels, and is composed of microscopic microLEDs each having a size of 1-10 micrometers. Compared to conventional liquid crystal display panels, the microLED display panels offer better contrast, response times and energy efficiency. Although both organic light-emitting diodes (OLEDs) and microLEDs possess good energy efficiency, the microLEDs, based on group III/V (e.g., GaN) LED technology, offer higher brightness, higher luminous efficacy and longer lifespan than the OLEDs.

During manufacturing a microLED display panel, individual microLEDs should be picked up and transferred to a display panel by magnetic force or vacuum suction force. Take vacuum suction apparatus as an example, the ratio of height to inner diameter of a suction nozzle should be less than a threshold value in order to ensure suction capability. As the size of the microLED is small, the inner diameter and the associated height of the suction nozzle should be small enough. As a result, the vacuum suction apparatus in operation is apt to deformation or even fracture, thereby reducing suction efficiency.

A need has thus arisen to propose novel vacuum apparatus in order to increase suction efficiency and enhance robustness and reliability.

SUMMARY OF THE INVENTION

In view of the foregoing, it is an object of the embodiment of the present invention to provide vacuum suction apparatus with scalability in operation, increased suction capability and efficiency, and enhanced robustness and reliability.

According to one embodiment, a vacuum suction apparatus includes a semiconductor substrate and a cover plate. The semiconductor substrate includes a top portion having a plurality of first grooves and a bottom portion having a plurality of through holes, each first groove correspondingly connecting with at least one through hole, and the first groove having a width greater than a width of the through hole. The cover plate is disposed on a top surface of the semiconductor substrate. A vacuum chamber, connecting with the first grooves, is disposed on at least one edge of the vacuum suction apparatus. In one embodiment, the first grooves are continuous grooves disposed longitudinally, each continuous groove correspondingly connecting with the through holes. The vacuum chamber is perpendicular to the continuous grooves and directly connects with the continuous grooves. In another embodiment, the first grooves are discontinuous grooves arranged in matrix form, each discontinuous groove correspondingly connecting with one through hole. Channels are connected between adjacent discontinuous grooves, and the vacuum chamber is connected with the discontinuous grooves via the channels.

According to another embodiment, a vacuum suction apparatus includes a semiconductor substrate and a vacuum cover. The semiconductor substrate includes a top portion having a plurality of first grooves and a bottom portion having a plurality of through holes, each first groove correspondingly connecting with at least one through hole, and the first groove having a width greater than a width of the through hole. The vacuum cover is disposed above the semiconductor substrate, the vacuum cover and the semiconductor substrate defining a vacuum chamber.

DETAILED DESCRIPTION OF THE INVENTION

Figure 1A:
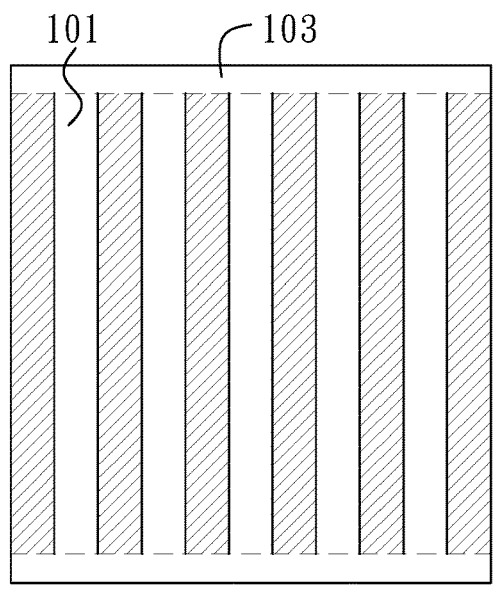
FIG. 1A shows a top view illustrated of vacuum suction apparatus according to a first embodiment of the present invention.
Figure 1B:
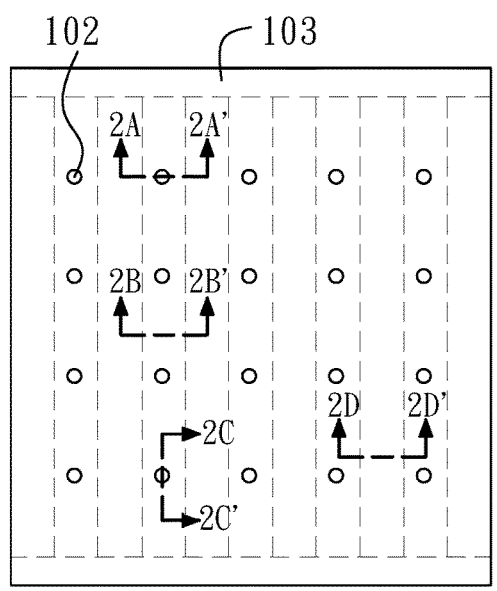
FIG. 1B shows a bottom view of the vacuum suction apparatus of FIG. 1A.
Figure 1C:
FIG. 1C shows a side view of the vacuum suction apparatus of FIG. 1A.

FIG. 1A shows a top view illustrated of vacuum suction apparatus 100 according to a first embodiment of the present invention, FIG. 1B shows a bottom view of the vacuum suction apparatus 100 of FIG. 1A, and FIG. 1C shows a side view of the vacuum suction apparatus 100 of FIG. 1A. The vacuum suction apparatus 100 of the embodiment may be adaptable to picking up miniature devices such as microLEDs. Take the microLEDs as an example, the vacuum suction apparatus 100 can pick up microLEDs (not shown), which are then transferred and mounted on a substrate, thereby resulting in a microLED display panel. In the specification, the microLEDs generally have a size of 1-10 micrometers or smaller owing to technology advance in the future.

In the embodiment, the vacuum suction apparatus 100 may include a semiconductor substrate 11 such as a silicon wafer. The vacuum suction apparatus 100 may include a cover plate 12, which is disposed on a top surface of the semiconductor substrate 11. The cover plate 12 of the embodiment may, for example, include a silicon wafer, glass or sapphire. In one example, a bottom surface of the cover plate 12 may be adhered to a top surface of the semiconductor substrate 11. The vacuum suction apparatus 100 as shown in FIG. 1A/1B may be cut from a wafer. In other examples, however, the vacuum suction apparatus 100 may be not cut from, but integrated with, a wafer.

According to one aspect of the embodiment, a top portion (i.e., the portion near a top surface) of the semiconductor substrate 11 may have a plurality of continuous grooves 101. As exemplified in FIG. 1A, the continuous grooves 101 are disposed longitudinally. As exemplified in FIG. 1B, a bottom portion (i.e., the portion near a bottom surface) of the semiconductor substrate 11 may have a plurality of through holes 102, wherein each groove 101 correspondingly connects with a plurality of through holes 102, and the groove 101 has a width being substantially greater than a width of the through hole 102. The through holes 102 are positioned where the miniature devices are transferred. Accordingly, a pitch of the through holes 102 is equal to a pitch of transferred miniature devices. Moreover, the size of an opening of the through hole 102 at the bottom surface of the semiconductor substrate 11 is smaller than the size of the miniature device in order to ensure air tight. In one example, the diameter size of the through hole 102 is smaller than 10 micrometers, and the lateral width of the continuous groove 101 is smaller than 100 micrometers. For brevity, only some continuous grooves 101 and through holes 102 are shown. The opening of the through hole 102 at the bottom surface of the semiconductor substrate 11 may have a shape other than a circle as exemplified in FIG. 1B.

Figure 2A:
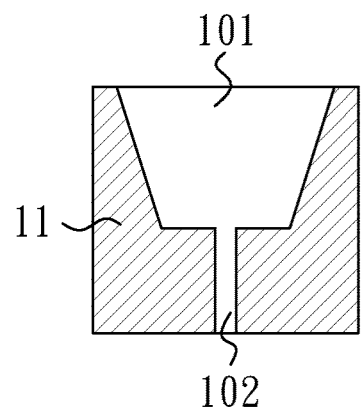
FIG. 2A to FIG. 2D show cross-sectional views along section lines of FIG. 1B, respectively.

FIG. 2A shows a cross-sectional lateral view along a section line 2A-2A' of FIG. 1B, where the section line 2A-2A' is perpendicular to the continuous groove 101 and passes the through hole 102. In the preferred embodiment shown in FIG. 2A, the continuous groove 101 may have a V-shaped lateral cross-section in that the width of the continuous groove 101 becomes wider as approaching the top surface of the semiconductor substrate 11. In other examples, the continuous groove 101 may have a U-shaped lateral cross-section in that the width of the continuous groove 101 is substantially the same along the height of the semiconductor substrate 11. In the preferred embodiment shown in FIG. 2A, the through hole 102 may have a U-shaped cross-section in that the size of the through hole 102 is substantially the same along the height of the semiconductor substrate 11. In other examples, the through hole 102 may have a V-shaped or inverted V-shaped cross-section.

Figure 2B:
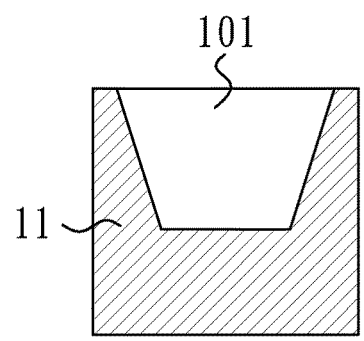
Figure 2C:
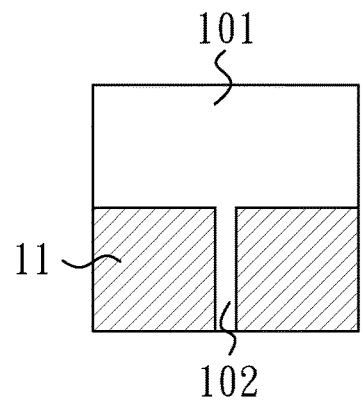
Figure 2D:
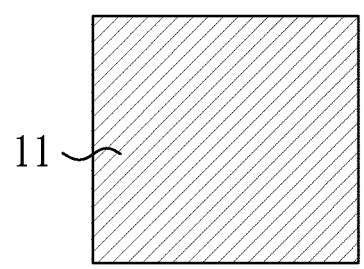

FIG. 2B shows a cross-sectional lateral view along a section line 2B-2B' of FIG. 1B. As the section line 2B-2B' is perpendicular to the continuous groove 101 but does not pass the through hole 102, the cross-section of the continuous groove 101 but not the through hole 102 is shown. FIG. 2C shows a cross-sectional longitudinal view along a section line 2C-2C' of FIG. 1B. As the section line 2C-2C' is parallel to the continuous groove 101 and passes the through hole 102, the cross-section of both the continuous groove 101 and the through hole 102 is shown. FIG. 2D shows a cross-sectional lateral view along a section line 2D-2D' of FIG. 1B. As the section line 2D-2D' passes outside the continuous groove 101, the cross-section of neither the continuous groove 101 nor the through hole 102 is shown.

The continuous grooves 101 and the through holes 102 may be made by conventional semiconductor process or microfabrication such as anisotropic etching with an etch rate depending on a crystal face. It is noted that the continuous groove 101 and the through hole 102 may be made in sequence from one side (e.g., from the top surface of the semiconductor substrate 11). In other examples, the continuous groove 101 and the through hole 102 may be respectively made from different sides (e.g., from the top and bottom surfaces of the semiconductor substrate 11).

Referring back to FIG. 1A/1B, at least one vacuum chamber 103, being perpendicular to the continuous grooves 101, is disposed on at least one edge of the semiconductor substrate 11 of the vacuum suction apparatus 100 and directly connects with the continuous grooves 101. When a vacuum pump (not shown) produces vacuum to cause the pressure in the vacuum chamber 103 to be less than atmospheric pressure, miniature devices can thus be sucked.

Figure 3A:
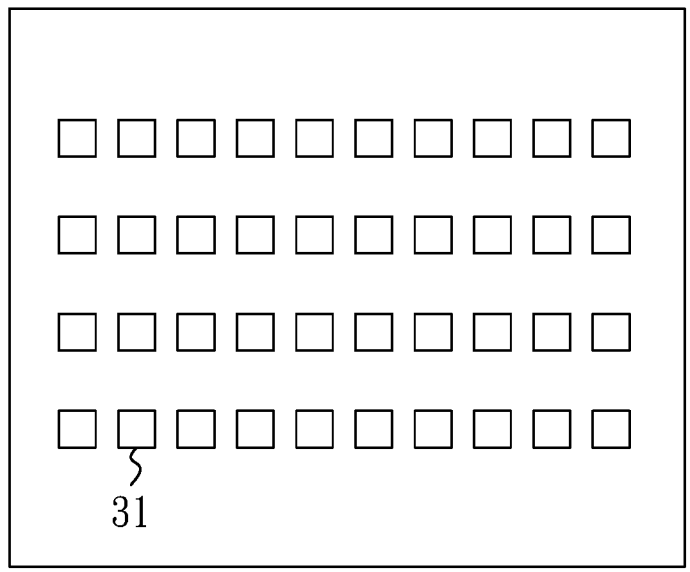
FIG. 3A schematically exemplifies microLEDs before transfer.
Figure 3B:
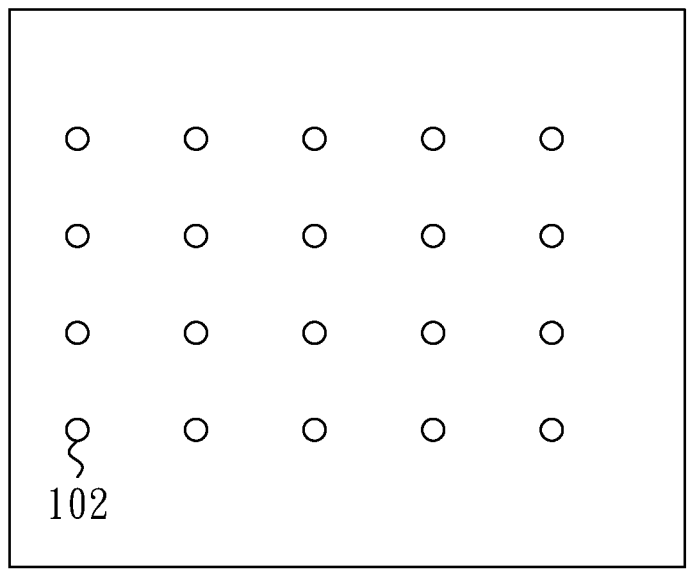
FIG. 3B exemplifies the through holes of the vacuum suction apparatus.
Figure 3C:
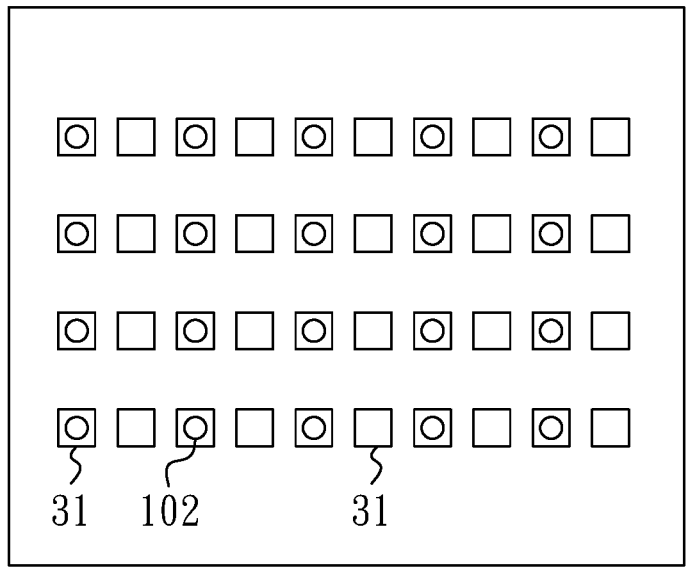
FIG. 3C and FIG. 3D show some microLEDs are picked up by the vacuum suction apparatus.
Figure 3D:
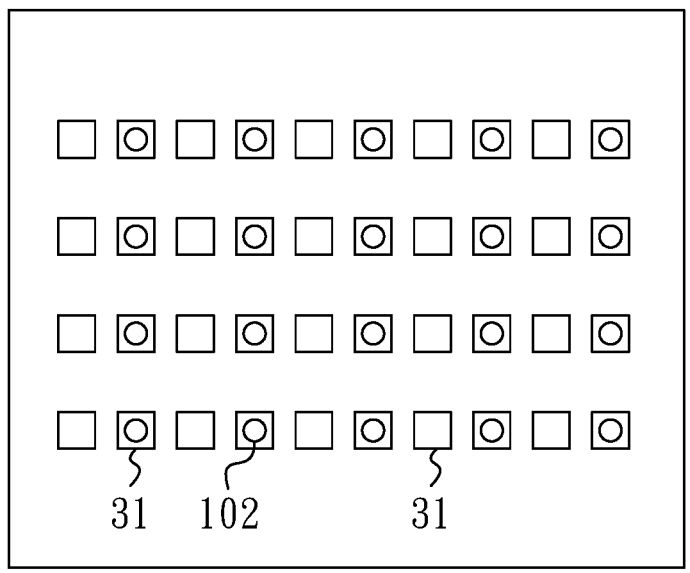

As mentioned above, the vacuum suction apparatus 100 of the embodiment may be used to transfer microLEDs to a display panel. Accordingly, a pitch of the through holes 102 shown in FIG. 1B may be designed according to a pitch of the microLEDs before transfer and a pitch of the microLEDs after the transfer. FIG. 3A schematically exemplifies microLEDs 31 before transfer, and FIG. 3B exemplifies the through holes 102 of the vacuum suction apparatus 100. In this example, the pitch of the through holes 102 is two times the pitch of the microLEDs 31 before transfer. As exemplified in FIG. 3C, the vacuum suction apparatus 100 picks up some of the microLEDs 31. After transfer, as exemplified in FIG. 3D, the vacuum suction apparatus 100 is shifted and is then used to pick up other microLEDs 31. Accordingly, the vacuum suction apparatus 100 of the embodiment may have scalability in operation.

According to the embodiment, the sizes and cross-sections of the continuous groove 101 and the through hole 102 are different. To the contrary, through holes with single shape are used in conventional vacuum suction apparatus. Accordingly, the present embodiment provides vacuum suction apparatus with increased suction capability and enhanced efficiency.

Moreover, the vacuum chamber 103 of the embodiment is disposed on the edge of the vacuum suction apparatus 100. Compared with the vacuum chamber disposed above or below the conventional vacuum suction apparatus which is apt to cause deformation or even fracture, the vacuum suction apparatus 100 of the embodiment provides enhanced robustness and reliability.

Figure 4A:
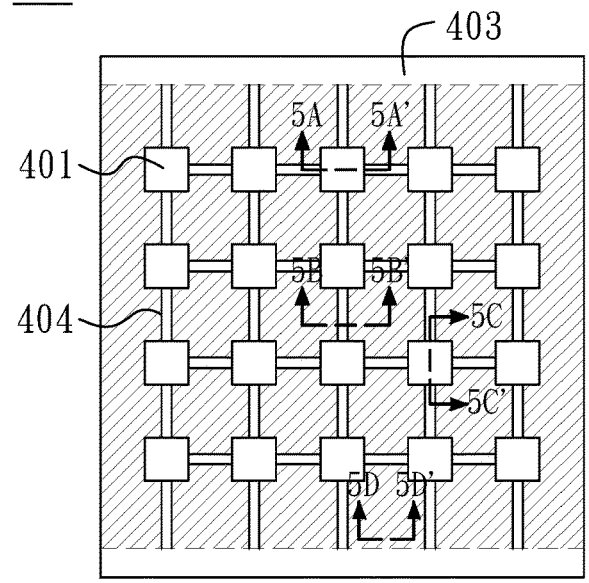
FIG. 4A shows a top view illustrated of vacuum suction apparatus according to a second embodiment of the present invention.
Figure 4B:
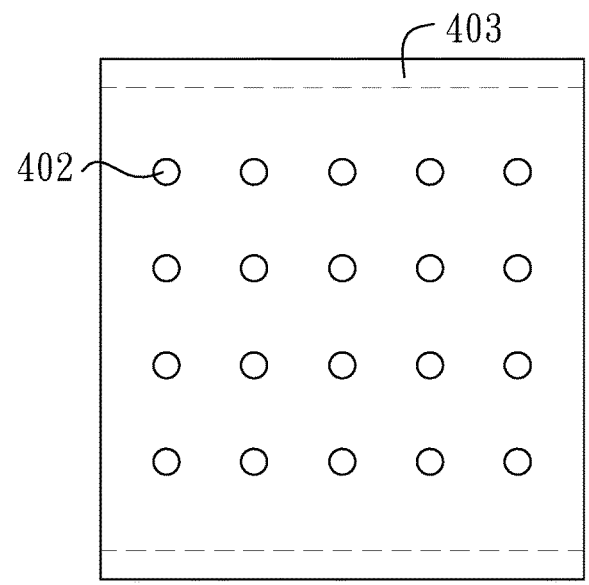
FIG. 4B shows a bottom view of the vacuum suction apparatus of FIG. 4A.
Figure 4C:
FIG. 4C shows a side view of the vacuum suction apparatus of FIG. 4A.

FIG. 4A shows a top view illustrated of vacuum suction apparatus 400 according to a second embodiment of the present invention, FIG. 4B shows a bottom view of the vacuum suction apparatus 400 of FIG. 4A, and FIG. 4C shows a side view of the vacuum suction apparatus 400 of FIG. 4A.

In the embodiment, the vacuum suction apparatus 400 may include a semiconductor substrate 41 such as a silicon wafer. The vacuum suction apparatus 400 may include a cover plate 42, such as a glass cover plate, which is disposed on a top surface of the semiconductor substrate 41. The vacuum suction apparatus 400 as shown in FIG. 4A/4B may be cut from a wafer. In other examples, however, the vacuum suction apparatus 400 may be not cut from, but integrated with, a wafer.

According to one aspect of the embodiment, a top portion (i.e., the portion near a top surface) of the semiconductor substrate 41 may have a plurality of discontinuous grooves 401. As exemplified in FIG. 4A, the discontinuous grooves 401 are arranged in matrix form. As exemplified in FIG. 4B, a bottom portion (i.e., the portion near a bottom surface) of the semiconductor substrate 41 may have a plurality of through holes 402, wherein each discontinuous groove 401 correspondingly connects with a through holes 402, and the discontinuous groove 401 has a width being substantially greater than a width of the through hole 402. The through holes 402 are positioned where the miniature devices are transferred. Accordingly, a pitch of the through holes 402 is equal to a pitch of transferred miniature devices. Moreover, the size of an opening of the through hole 402 at the bottom surface of the semiconductor substrate 41 is smaller than the size of the miniature device in order to ensure air tight. In one example, the diameter size of the through hole 402 is smaller than 10 micrometers, and the lateral width of the discontinuous groove 401 is smaller than 100 micrometers. For brevity, only some discontinuous grooves 401 and through holes 402 are shown. The opening of the through hole 402 at the bottom surface of the semiconductor substrate 41 may have a shape other than a circle as exemplified in FIG. 4B.

As shown in FIG. 4A, the top portion of the semiconductor substrate 41 may have a plurality of channels 404 connected between adjacent discontinuous grooves 401. In the embodiment, the channels 404 are disposed longitudinally and laterally, such that the discontinuous grooves 401 may connect each other longitudinally and laterally. In another embodiment, the channels 404 are disposed in only one direction (e.g., longitudinally), such that the discontinuous grooves 401 may connect each other longitudinally but not laterally.

Figure 5A:
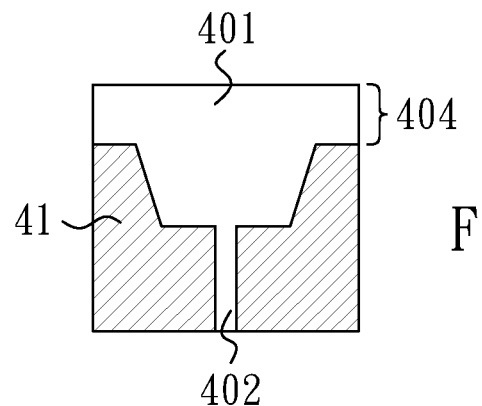
FIG. 5A to FIG. 5D show cross-sectional views along section lines of FIG. 4A, respectively.

FIG. 5A shows a cross-sectional lateral view along a section line 5A-5A' of FIG. 5A, where the section line 5A-5A' passes the discontinuous groove 101, the channel 404 and the through hole 402. In the preferred embodiment shown in FIG. 5A, the discontinuous groove 401 may have a V-shaped lateral cross-section in that the width of the discontinuous groove 401 becomes wider as approaching the top surface of the semiconductor substrate 41. In other examples, the discontinuous groove 401 may have a U-shaped lateral cross-section in that the width of the discontinuous groove 401 is substantially the same along the height of the semiconductor substrate 41. In the preferred embodiment shown in FIG. 5A, the through hole 402 may have a U-shaped cross-section in that the size of the through hole 402 is substantially the same along the height of the semiconductor substrate 41. In other examples, the through hole 402 may have a V-shaped or inverted V-shaped cross-section. As shown in FIG. 5A, the channel 404 has a depth less than the discontinuous groove 401.

Figure 5B:
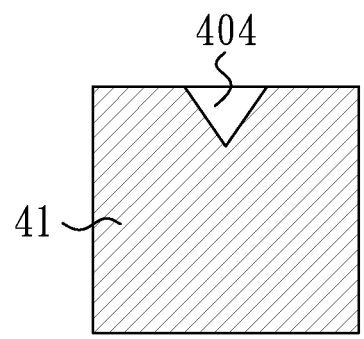
Figure 5C:
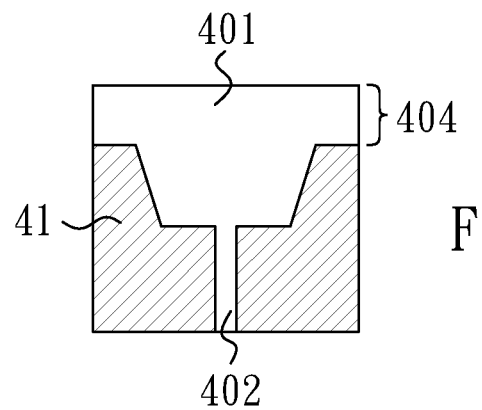
Figure 5D:
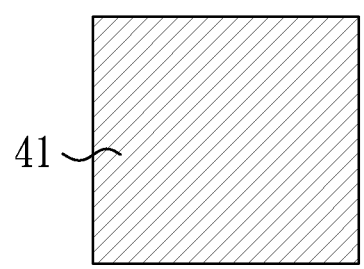

FIG. 5B shows a cross-sectional lateral view along a section line 5B-5B' of FIG. 4A. As the section line 5B-5B' passes the channel 404 but not the through hole 402 and the discontinuous groove 401, the cross-section of the channel 404 but not the through hole 402 and the discontinuous groove 401 is shown. The channel 404 shown in FIG. 5B may have a V-shaped lateral cross-section, but may have other shapes instead in other examples. FIG. 5C shows a cross-sectional longitudinal view along a section line 5C-5C' of FIG. 4A. As the section line 5C-5C' passes the discontinuous groove 401, the channel 404 and the through hole 402, the cross-section of all the discontinuous groove 401, the channel 404 and the through hole 402 is shown. FIG. 5D shows a cross-sectional lateral view along a section line 5D-5D' of FIG. 4A. As the section line 5D-5D' passes outside the discontinuous groove 401 and the channels 404, the cross-section of none the discontinuous groove 401, the channel 404 and the through hole 402 is shown.

The discontinuous grooves 401, the channels 404 and the through holes 402 may be made by conventional semiconductor process or microfabrication such as anisotropic etching with an etch rate depending on a crystal face. It is noted that the channel 404, the discontinuous groove 401 and the through hole 402 may be made in sequence from one side (e.g., from the top surface of the semiconductor substrate 41). In other examples, the channel 404, the discontinuous groove 401 and the through hole 402 may be respectively made from different sides (e.g., from the top and bottom surfaces of the semiconductor substrate 41).

Referring back to FIG. 4A/4B, at least one vacuum chamber 403 is disposed on at least one edge of the semiconductor substrate 41 of the vacuum suction apparatus 400 and directly connects with the discontinuous grooves 401 via the channels 404. When a vacuum pump (not shown) produces vacuum to cause the pressure in the vacuum chamber 403 to be less than atmospheric pressure, miniature devices can thus be sucked.

Figure 6A:
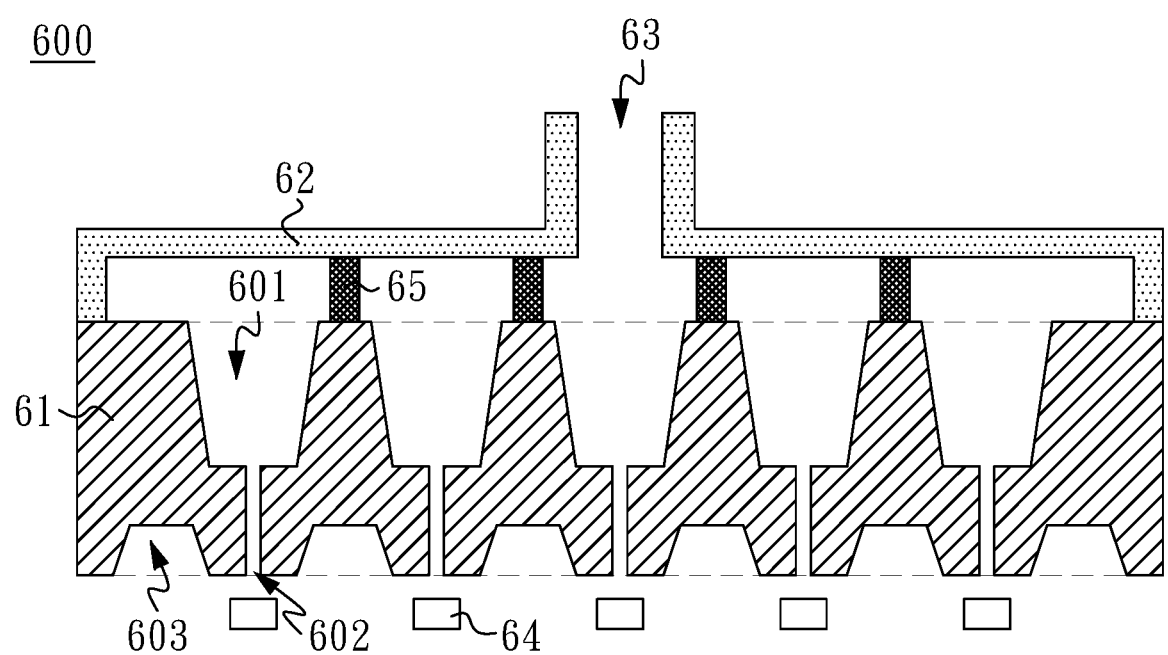
FIG. 6A shows a cross-sectional view of vacuum suction apparatus according to a third embodiment of the present invention.

FIG. 6A shows a cross-sectional view of vacuum suction apparatus 600 according to a third embodiment of the present invention. The vacuum suction apparatus 600 of the embodiment may be adaptable to picking up miniature devices such as microLEDs.

In the embodiment, the vacuum suction apparatus 600 may include a semiconductor substrate 61 such as a silicon wafer. The vacuum suction apparatus 600 as shown in FIG. 6A may be cut from a wafer. In other examples, however, the vacuum suction apparatus 600 may be not cut from, but integrated with, a wafer. A top portion (i.e., the portion near a top surface) of the semiconductor substrate 61 may have a plurality of (first) grooves 601, which may be like the continuous grooves 101 (FIG. 1A) or the discontinuous grooves 401 (FIG. 4A). As exemplified in FIG. 6A, a bottom portion (i.e., the portion near a bottom surface) of the semiconductor substrate 61 may have a plurality of through holes 602, wherein each (first) groove 601 correspondingly connects with at least one through hole 602, and the (first) groove 601 has a width being substantially greater than a width of the through hole 602. The through holes 602 are positioned where the miniature devices are transferred. Accordingly, a pitch of the through holes 602 is equal to a pitch of transferred miniature devices. Moreover, the size of an opening of the through hole 602 at the bottom surface of the semiconductor substrate 61 is smaller than the size of the miniature device in order to ensure air tight. In one example, the diameter size of the through hole 602 is smaller than 10 micrometers, and the width of the (first) groove 601 is smaller than 100 micrometers. For brevity, only some (first) grooves 601 and through holes 602 are shown.

The vacuum suction apparatus 600 may include a vacuum cover 62, which is disposed above the semiconductor substrate 61. The vacuum cover 62 of the embodiment may, for example, include a silicon wafer, glass or sapphire. The vacuum cover 62 and the semiconductor substrate 61 construct (or define) a vacuum chamber, and an opening 63 of the vacuum cover 62 is connected to a vacuum pump (not shown). When the vacuum pump produces vacuum to cause the pressure in the vacuum chamber to be less than atmospheric pressure, miniature devices 64 can thus be sucked. Although the opening 63 is disposed at the top of the vacuum cover 62 as shown in FIG. 6A, the opening 63 may be disposed at other places in other examples.

In one embodiment, the vacuum suction apparatus 600 may include at least one post 65, disposed between a bottom surface of the vacuum cover 62 and a top surface of the semiconductor substrate 61, which is used to support the vacuum cover 62 in order to prevent collapse of the vacuum cover 62 while producing vacuum.

Figure 6B:
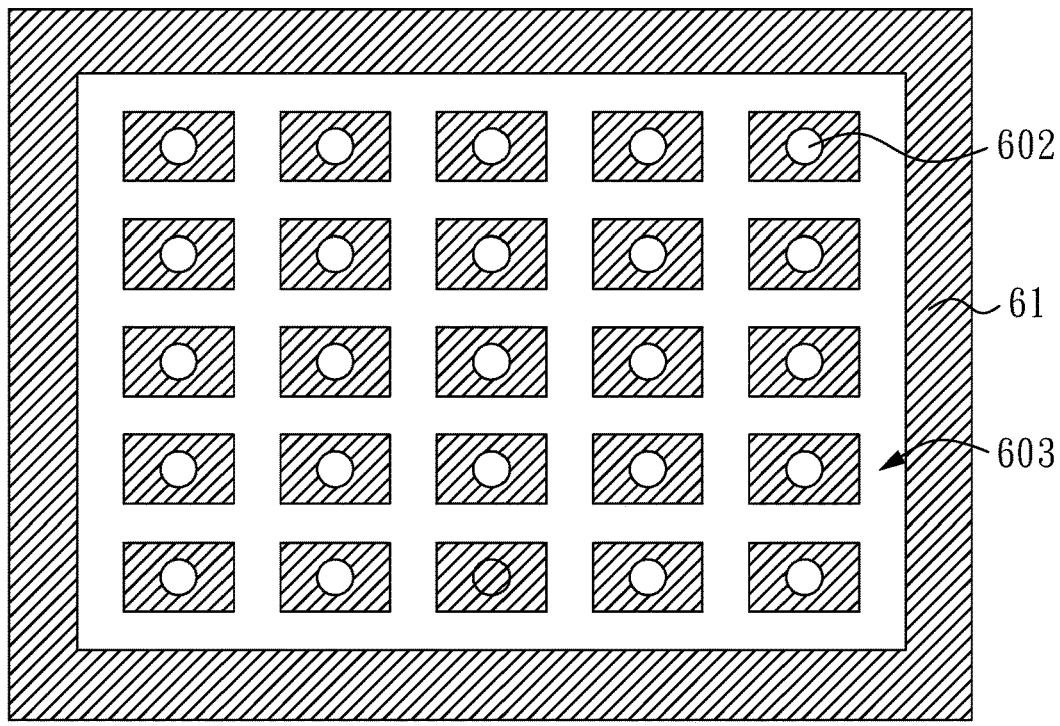
FIG. 6B shows a bottom view of the vacuum suction apparatus of FIG. 6A.
Figure 6C:
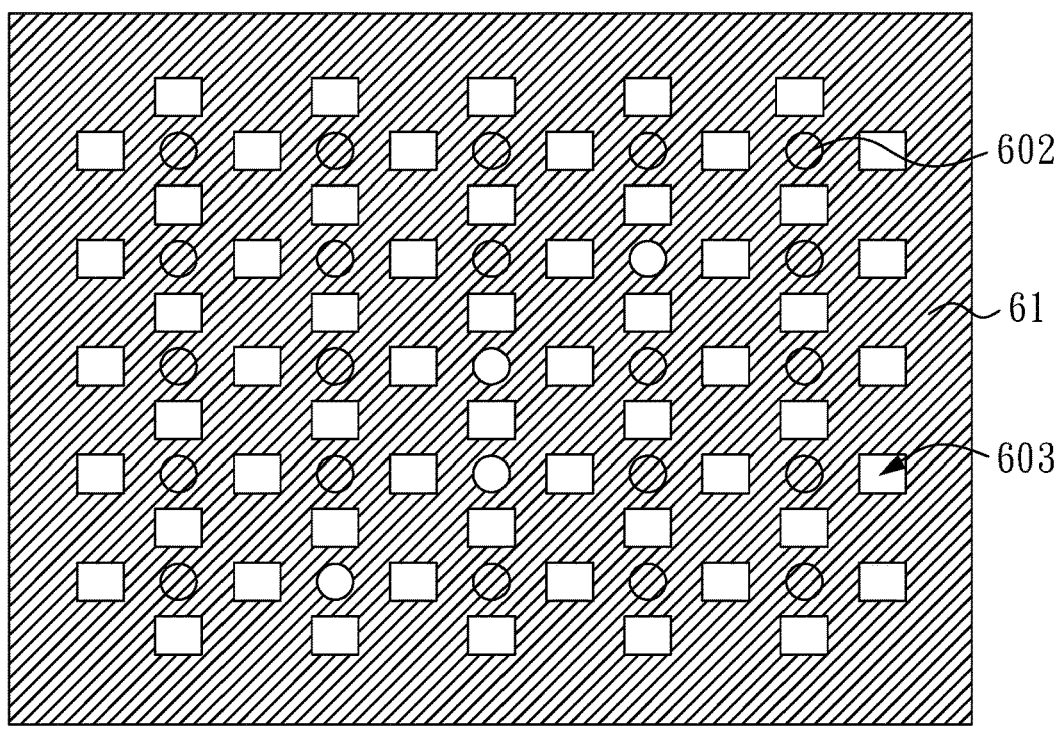
FIG. 6C shows another bottom view of the vacuum suction apparatus of FIG. 6A.

In one embodiment, the bottom portion of the semiconductor substrate 61 may have a plurality of second grooves 603 disposed between adjacent through holes 602. When the vacuum suction apparatus 600 picks up and transfers the miniature devices 64, the second grooves 603 can prevent the bottom surface of the semiconductor substrate 61 from touching transferred miniature devices on a substrate. The second grooves 603 may be continuous grooves as shown in a bottom view of FIG. 6B, where the continuous second grooves 603 are disposed longitudinally and/or laterally at the bottom portion of the semiconductor substrate 61. The second grooves 603 may be discontinuous grooves as shown in a bottom view of FIG. 6C, wherein the discontinuous second grooves 603 are disposed in matrix form at the bottom portion of the semiconductor substrate 61.

The first grooves 601, the second grooves 603 and the through holes 602 may be made by conventional semiconductor process or microfabrication such as anisotropic etching with an etch rate depending on a crystal face. It is noted that the first grooves 601, the second grooves 603 and the through holes 602 may be made in any sequence or be made at the same time.

Figure 6D:
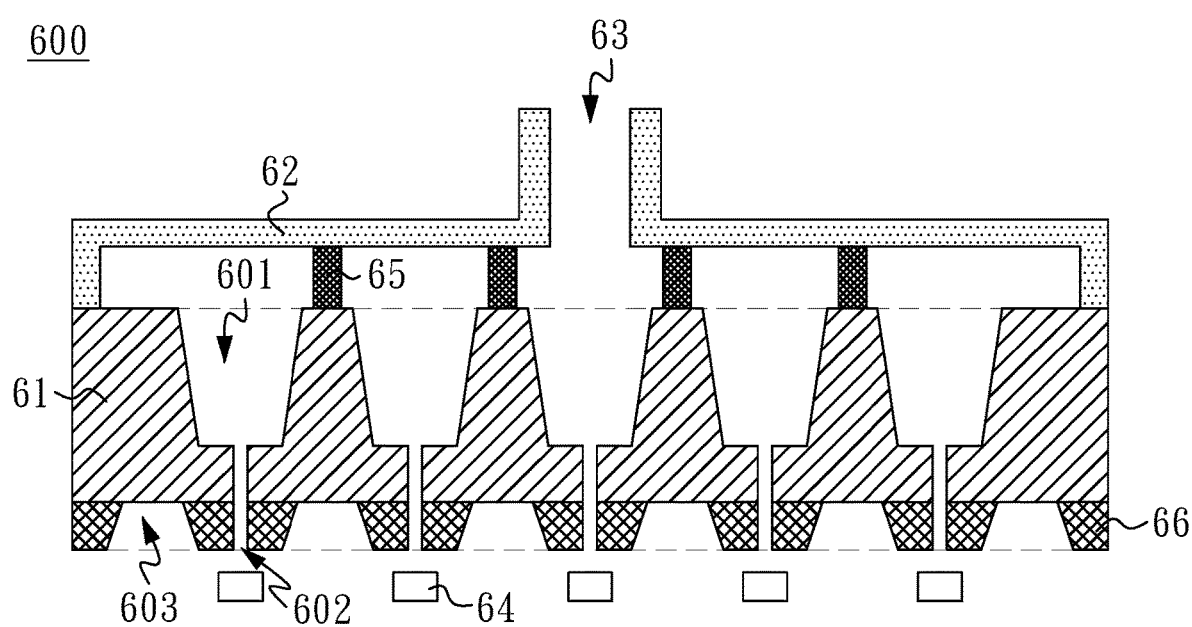
FIG. 6D shows a cross-sectional view of vacuum suction apparatus according to a modified third embodiment of the present invention.

FIG. 6D shows a cross-sectional view of vacuum suction apparatus 600 according to a modified third embodiment of the present invention. In the embodiment, a buffer layer 66 is formed, for example, by coating, on the bottom surface of the semiconductor substrate 61. The buffer layer 66 may include a soft (or flexible) material such as photo resist. The buffer layer 66 may have the second grooves 603 and the through holes 602 formed therein. The through hole 602 in the buffer layer 66 may have a diameter being the same as or smaller than the through hole 602 in the semiconductor substrate 61. Compared to FIG. 6A, the buffer layer 66, instead of the entire semiconductor substrate 61, may be easily replaced when the through holes 602 are blocked.

Figure 7A:
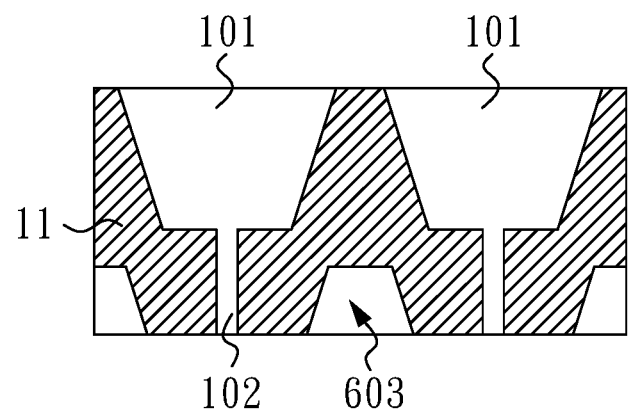
FIG. 7A shows a cross-sectional lateral view of the first embodiment of the present invention.
Figure 7B:
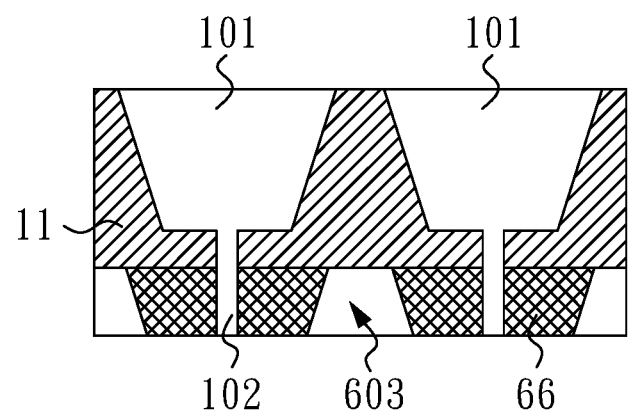
FIG. 7B shows a cross-sectional lateral view of a modified first embodiment of the present invention.

The second grooves 603 may be adaptable to the first embodiment of the present invention. FIG. 7A shows a cross-sectional lateral view of the first embodiment of the present invention, where the second grooves 603 are disposed between adjacent through holes 102, and the second groove 603 may have a width greater than the width of the miniature device. The second grooves 603 may be continuous grooves disposed at the bottom portion of the semiconductor substrate 11 with a bottom view similar to FIG. 6B. The second grooves 603 may be discontinuous grooves, arranged in matrix form, disposed at the bottom portion of the semiconductor substrate 11 with a bottom view similar to FIG. 6C. FIG. 7B shows a cross-sectional lateral view of a modified first embodiment of the present invention, where a buffer 66 is formed on the bottom surface of the semiconductor substrate 11. The buffer layer 66 may have the second grooves 603 and the through holes 102 formed therein.

Figure 8A:
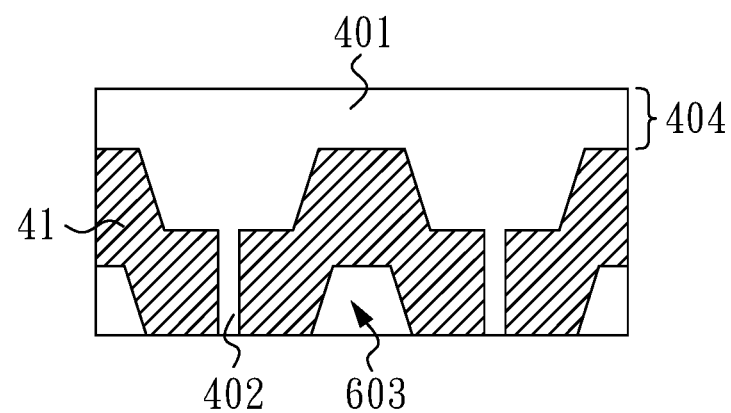
FIG. 8A shows a cross-sectional lateral view of the second embodiment of the present invention.
Figure 8B:
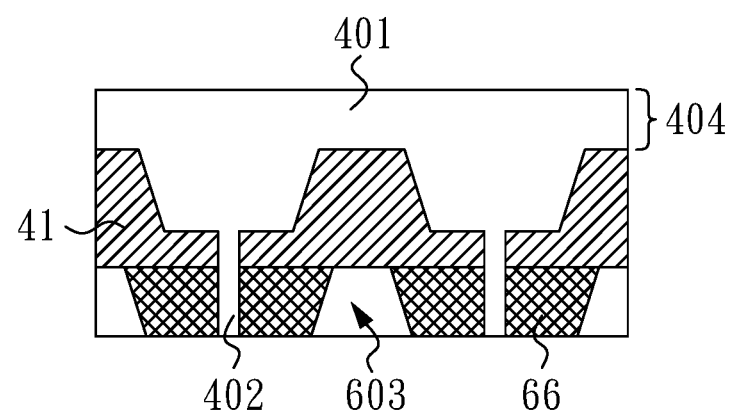
FIG. 8B shows a cross-sectional lateral view of a modified second embodiment of the present invention.

The second grooves 603 may be adaptable to the second embodiment of the present invention. FIG. 8A shows a cross-sectional lateral view of the second embodiment of the present invention, where the second grooves 603 are disposed between adjacent through holes 402, and the second groove 603 may have a width greater than the width of the miniature device. The second grooves 603 may be continuous grooves disposed at the bottom portion of the semiconductor substrate 41 with a bottom view similar to FIG. 6B. The second grooves 603 may be discontinuous grooves, arranged in matrix form, disposed at the bottom portion of the semiconductor substrate 41 with a bottom view similar to FIG. 6C. FIG. 8B shows a cross-sectional lateral view of a modified first embodiment of the present invention, where a buffer 66 is formed on the bottom surface of the semiconductor substrate 41. The buffer layer 66 may have the second grooves 603 and the through holes 402 formed therein.

Although specific embodiments have been illustrated and described, it will be appreciated by those skilled in the art that various modifications may be made without departing from the scope of the present invention, which is intended to be limited solely by the appended claims.

What is claimed is:

1. A vacuum suction apparatus, comprising:
   a semiconductor substrate with a top portion having a plurality of first grooves and a bottom portion having a plurality of through holes, each first groove of said plurality of first grooves correspondingly connecting with at least one through hole of said plurality of through holes, and each first groove of the plurality of first grooves having a width greater than a width of each through hole of the plurality of through holes; and
   a cover plate disposed on a top surface of the semiconductor substrate;
   wherein a vacuum chamber, connecting with the plurality of first grooves, is disposed on at least one edge of the vacuum suction apparatus;
   wherein each first groove of the plurality of first grooves is a continuous groove disposed longitudinally, each continuous groove of said plurality of first continuous grooves correspondingly connecting with the at least one through hole of the plurality of through holes, and the first grooves of a same longitudinal line being connected directly but the first grooves belonging to different longitudinal lines being not connected directly;
   wherein the bottom portion of the semiconductor substrate includes a replaceable buffer layer, from which the plurality of through holes pass;
   wherein the bottom portion of the semiconductor substrate has a plurality of second grooves disposed between adjacent through holes of the plurality of through holes, each second groove of the plurality of second grooves having a width greater than a width of a miniature device.

2. The apparatus of claim 1, wherein the semiconductor substrate comprises a silicon wafer.

3. The apparatus of claim 1, wherein each continuous first groove of the plurality of grooves has a side being sloped and narrowed towards the corresponding at least one through hole of the plurality of through holes.

4. The apparatus of claim 1, wherein the vacuum chamber is perpendicular to the plurality of continuous grooves and directly connects with the plurality of continuous grooves.

5. The apparatus of claim 1, wherein a diameter size of each of the plurality of through holes is smaller than 10 micrometers, and a lateral width of each continuous groove of the plurality of continuous grooves is smaller than 100 micrometers.

6. The apparatus of claim 1, wherein each second groove of the plurality of the second grooves is a continuous groove disposed longitudinally and/or laterally at the bottom portion of the semiconductor substrate.

7. The apparatus of claim 1, wherein each second groove of the plurality of the second grooves is a discontinuous groove, arranged in matrix form, disposed at the bottom portion of the semiconductor substrate.

8. The apparatus of claim 1, wherein the cover plate comprises a silicon wafer.

9. The apparatus of claim 1, wherein the cover plate comprises glass.

10. The apparatus of claim 1, wherein the cover plate comprises sapphire.

11. A vacuum suction apparatus, comprising:
a semiconductor substrate with a top portion having a plurality of first grooves and a bottom portion having a plurality of through holes, each first groove of said plurality of first grooves correspondingly connecting with at least one through hole of said plurality of through holes, and each first groove of the plurality of first grooves having a width greater than a width of each through hole of the plurality of through holes; and
a vacuum cover disposed above the semiconductor substrate the vacuum cover and the semiconductor substrate defining a vacuum chamber;
wherein each first groove of the plurality of first grooves is a continuous groove disposed longitudinally, each continuous groove of said plurality of first continuous grooves correspondingly connecting with the at least one through hole of the plurality of through holes, and the first grooves of a same longitudinal line being connected directly but the first grooves belonging to different longitudinal lines being not connected directly;
wherein the bottom portion of the semiconductor substrate includes a replaceable buffer layer, from which the plurality of through holes pass; at least one post, disposed between a bottom surface of the vacuum cover and a top surface of the semiconductor substrate, for supporting the vacuum cover.

12. The apparatus of claim 11, wherein the vacuum cover comprises a silicon wafer.

13. The apparatus of claim 11, wherein the vacuum cover comprises glass.

14. The apparatus of claim 11, wherein the vacuum cover comprises sapphire.

15. The apparatus of claim 11, wherein the bottom portion of the semiconductor substrate has a plurality of second grooves disposed between adjacent through holes of the plurality of through holes, each second groove of the plurality of second grooves having a width greater than a width of a miniature device.

16. The apparatus of claim 15, wherein each second groove of the plurality of the second grooves is a continuous groove disposed longitudinally and/or laterally at the bottom portion of the semiconductor substrate.

17. The apparatus of claim 15, wherein each second groove of the plurality of the second grooves is a discontinuous groove, arranged in matrix form, disposed at the bottom portion of the semiconductor substrate.

18. The apparatus of claim 11, wherein the semiconductor substrate comprises a silicon wafer.

* * * * *